United States Patent
Sejima

(10) Patent No.: US 10,923,531 B2
(45) Date of Patent: Feb. 16, 2021

(54) NONVOLATILE MEMORY DEVICE HAVING AN OXIDIZED MAGNETIC MATERIAL FILM AROUND A MAGNETIC MATERIAL LAYER AND METHOD OF MANUFACTURING THE SAME

(71) Applicant: SONY CORPORATION, Tokyo (JP)

(72) Inventor: Koichi Sejima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/087,177

(22) PCT Filed: Feb. 8, 2017

(86) PCT No.: PCT/JP2017/004495
§ 371 (c)(1),
(2) Date: Sep. 21, 2018

(87) PCT Pub. No.: WO2017/169147
PCT Pub. Date: Oct. 5, 2017

(65) Prior Publication Data
US 2019/0067367 A1 Feb. 28, 2019

(30) Foreign Application Priority Data

Mar. 31, 2016 (JP) .............................. JP2016-071169

(51) Int. Cl.
*H01L 27/22* (2006.01)
*H01L 43/08* (2006.01)
(Continued)

(52) U.S. Cl.
CPC .......... *H01L 27/222* (2013.01); *G11C 11/155* (2013.01); *H01L 27/228* (2013.01);
(Continued)

(58) Field of Classification Search
CPC ....... H01L 27/228; H01L 43/02; H01L 43/08; H01L 43/10; H01L 43/12; G11C 11/155; G11C 11/161
See application file for complete search history.

(56) References Cited

U.S. PATENT DOCUMENTS

2011/0059557 A1 3/2011 Yamagishi et al.
2012/0091423 A1 4/2012 Sumino
(Continued)

FOREIGN PATENT DOCUMENTS

JP 2008-181971 8/2008
JP 2008181971 A * 8/2008
(Continued)

OTHER PUBLICATIONS

Machine translation of JP-2008181971, published Aug. 7, 2008.*
(Continued)

*Primary Examiner* — Younes Boulghassoul
(74) *Attorney, Agent, or Firm* — Sheridan Ross P.C.

(57) ABSTRACT

A nonvolatile memory device according to an embodiment of the present disclosure includes: a first electrode and a second electrode facing each other; a first magnetic material layer and a second magnetic material layer provided between the first electrode and the second electrode; an insulator layer provided between the first magnetic material layer and the second magnetic material layer; and an oxidized magnetic material film provided around the first magnetic material layer.

20 Claims, 11 Drawing Sheets

(51) Int. Cl.
   *H01L 43/12* (2006.01)
   *G11C 11/155* (2006.01)
   *H01L 43/10* (2006.01)
   *H01L 43/02* (2006.01)

(52) U.S. Cl.
   CPC .............. *H01L 43/08* (2013.01); *H01L 43/10* (2013.01); *H01L 43/12* (2013.01); *H01L 43/02* (2013.01)

(56) References Cited

U.S. PATENT DOCUMENTS

| | | | | |
|---|---|---|---|---|
| 2013/0099338 A1* | 4/2013 | Nakayama | ......... | G01B 9/02091 257/421 |
| 2013/0313506 A1* | 11/2013 | Murayama | .............. | H01L 43/12 257/4 |
| 2015/0069550 A1* | 3/2015 | Sugiura | ................... | H01L 43/08 257/421 |
| 2017/0062705 A1* | 3/2017 | Yamakawa | ............. | H01L 43/02 |
| 2017/0084822 A1* | 3/2017 | Kim | ........................ | H01L 43/08 |
| 2018/0190335 A1* | 7/2018 | Ohmori | ................ | G11B 5/3906 |

FOREIGN PATENT DOCUMENTS

| | | |
|---|---|---|
| JP | 2011-054873 | 3/2011 |
| JP | 2012-084765 | 4/2012 |

OTHER PUBLICATIONS

International Search Report prepared by the Japan Patent Office dated Mar. 7, 2017, for International Application No. PCT/JP2017/004495.

\* cited by examiner

[ FIG. 1 ]
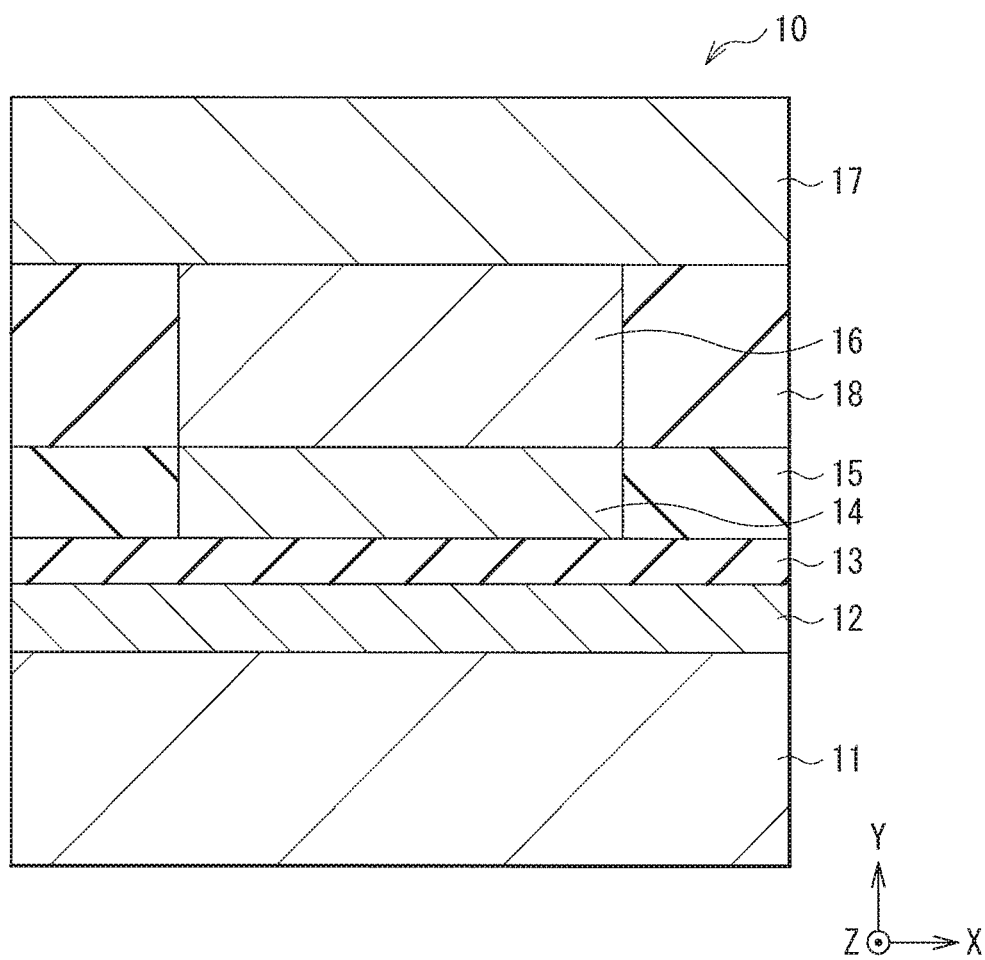

[FIG. 2A]
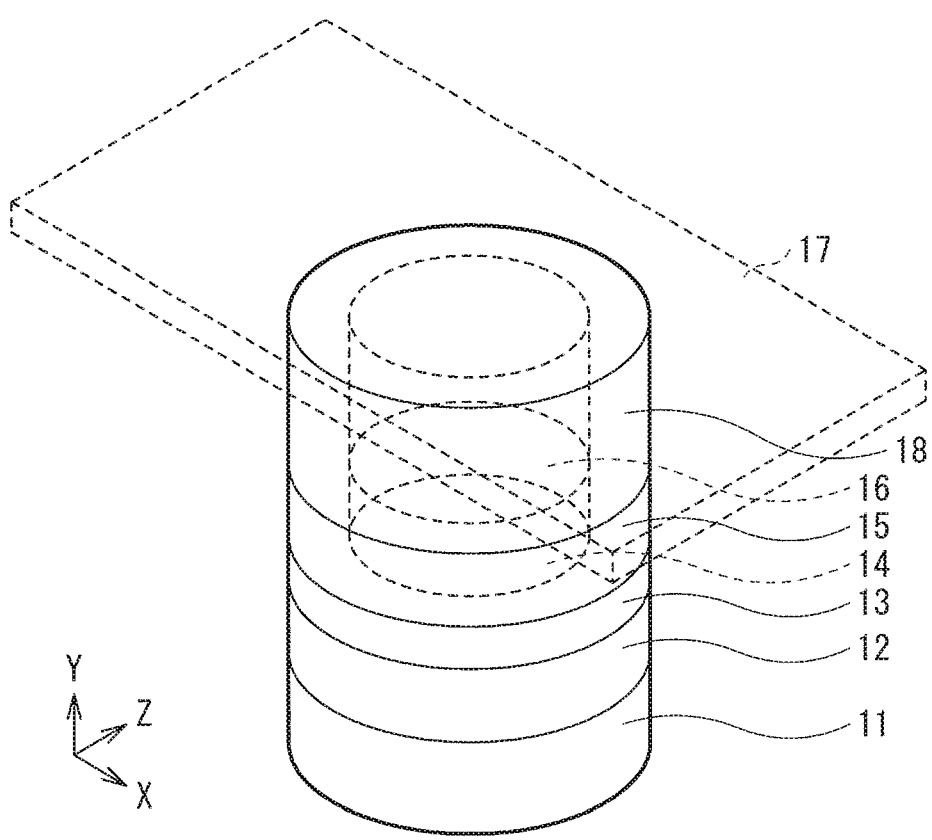

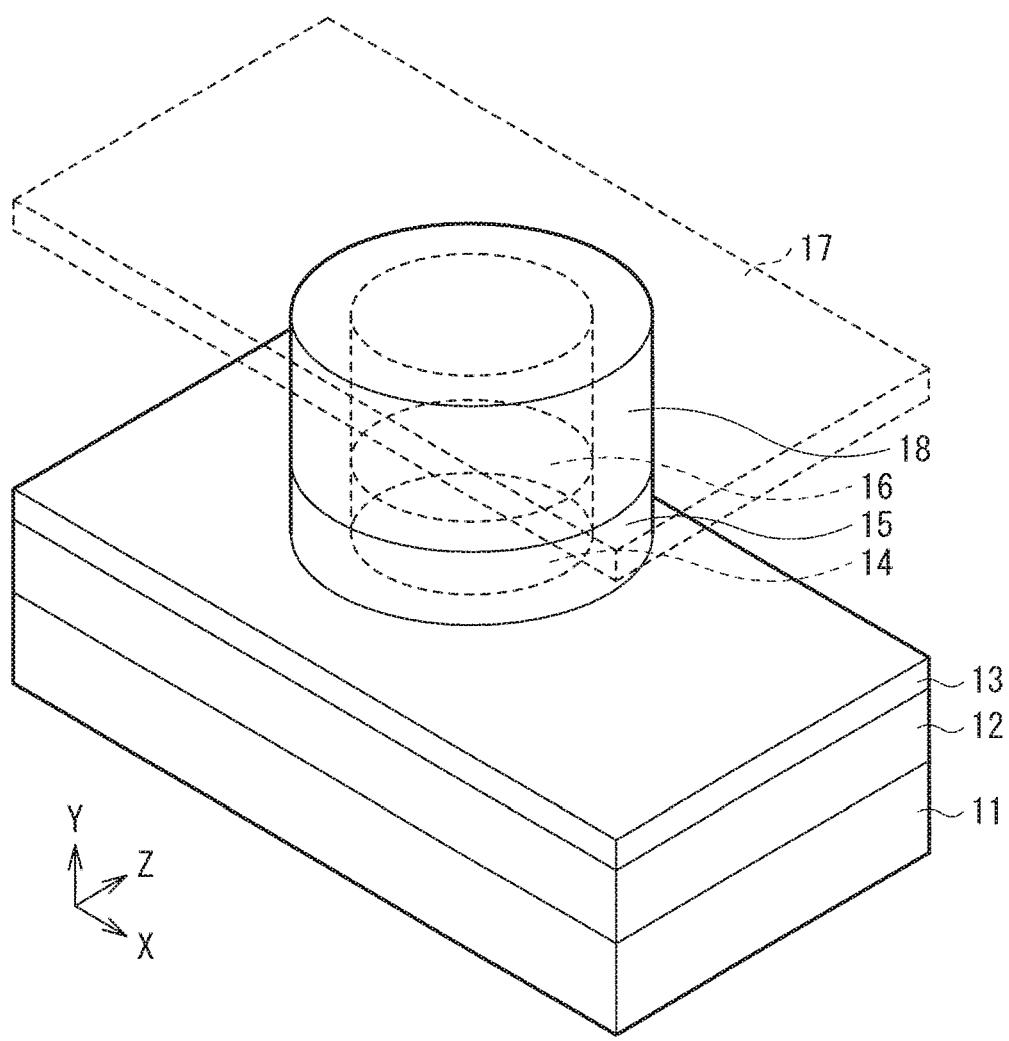
[FIG. 2B]

[FIG. 3]
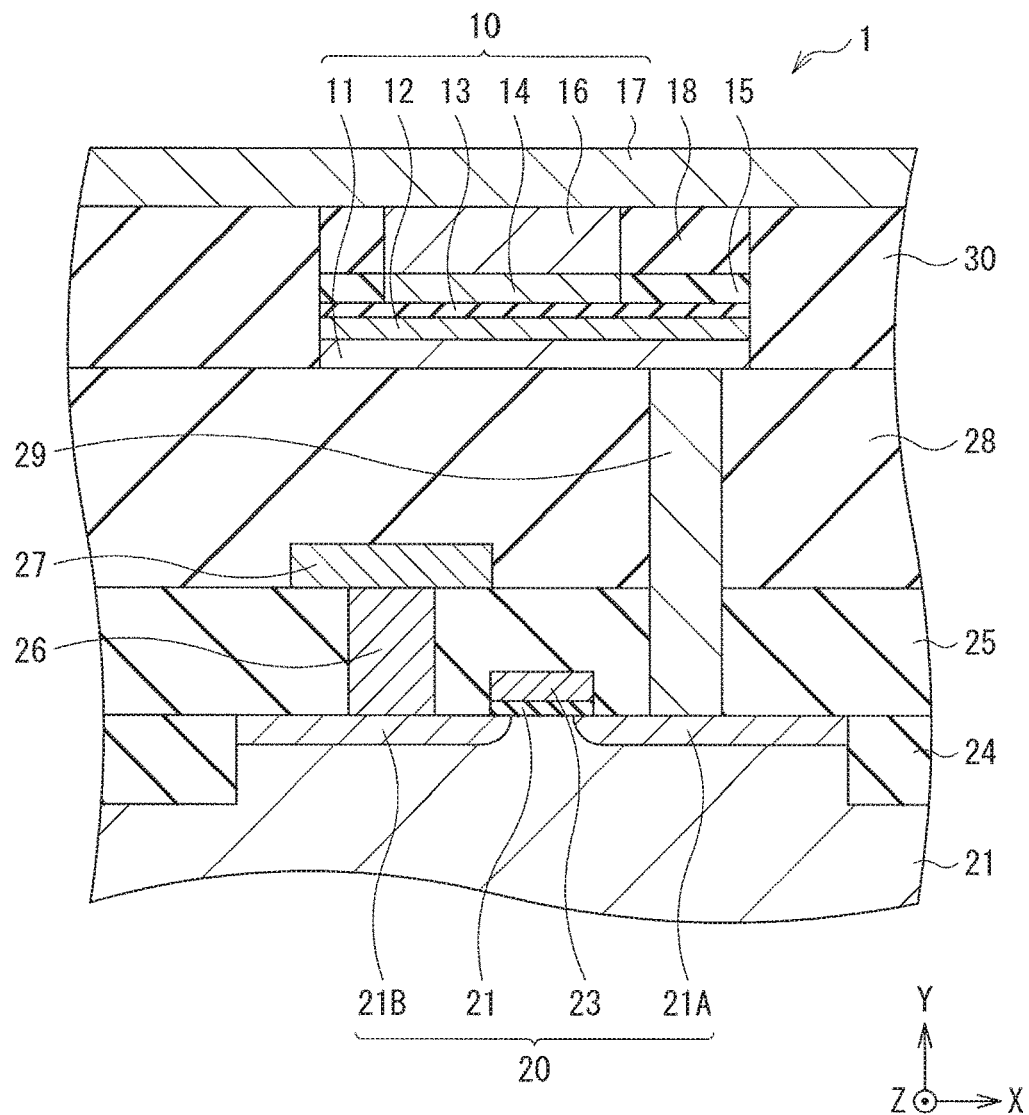
[FIG. 4]
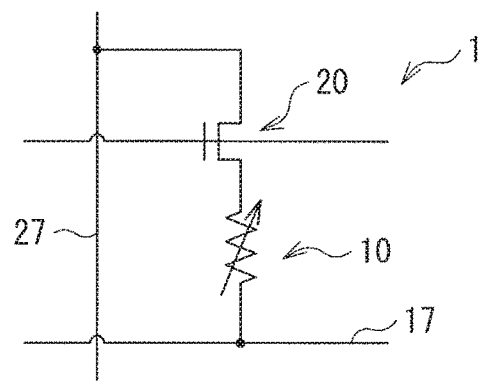

[ FIG. 5A ]
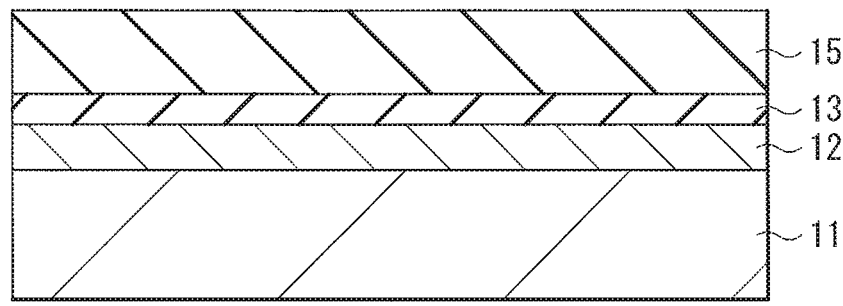
[ FIG. 5B ]
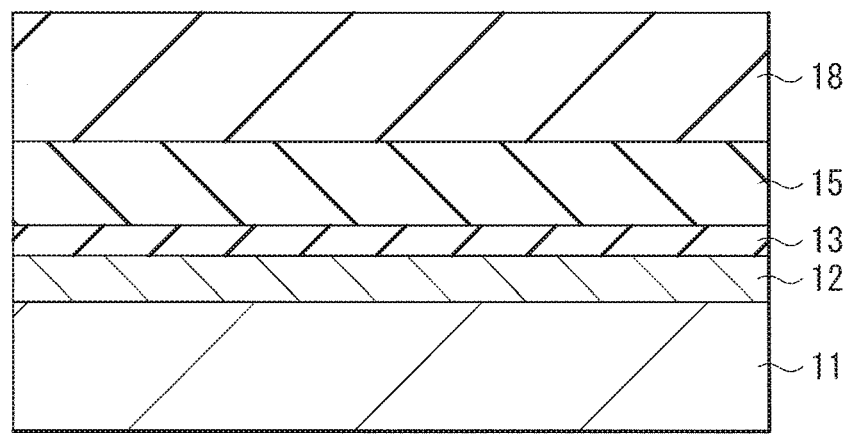
[ FIG. 5C ]
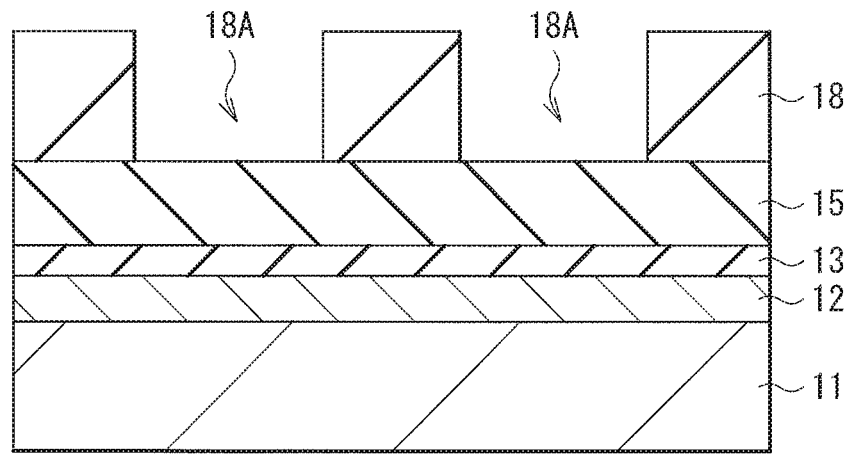

[ FIG. 6A ]
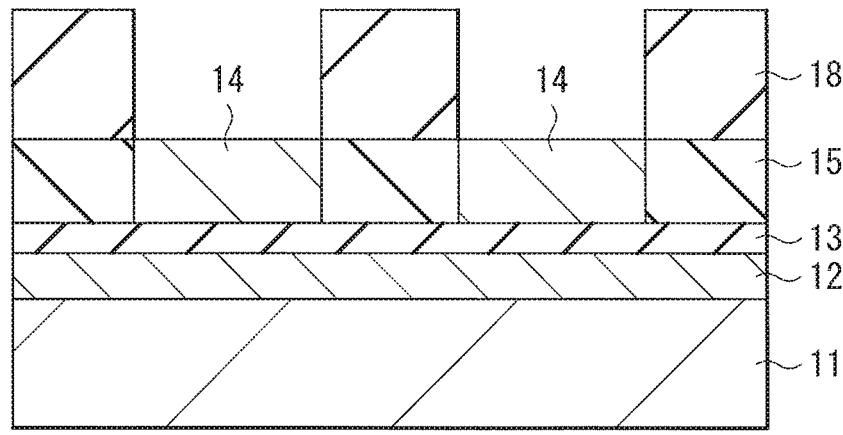
[ FIG. 6B ]
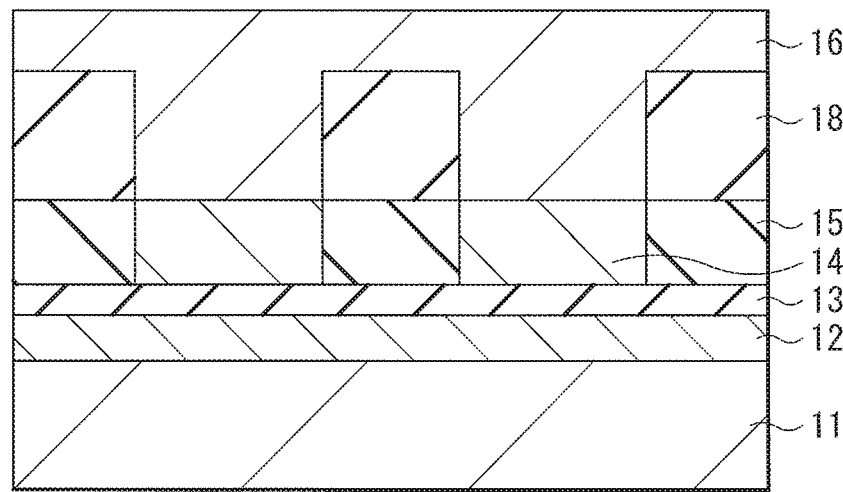
[ FIG. 6C ]
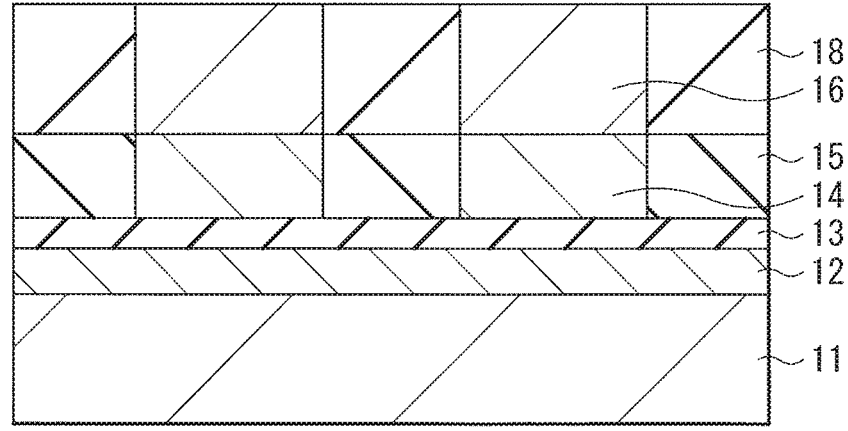

[ FIG. 7A ]
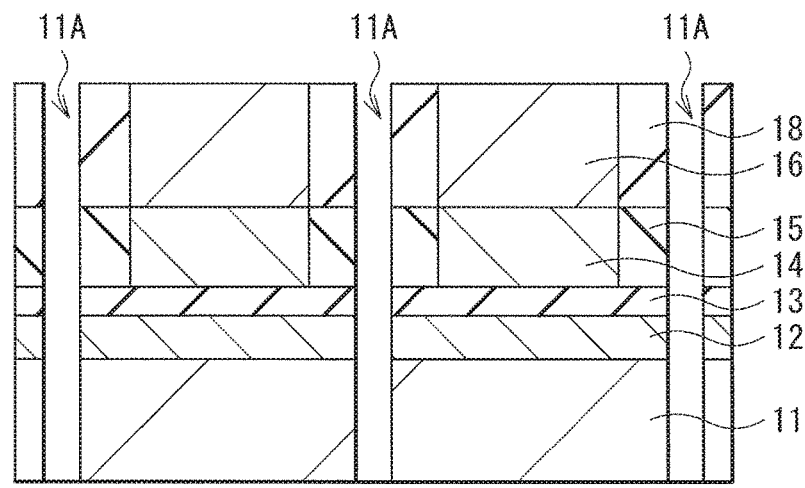
[ FIG. 7B ]
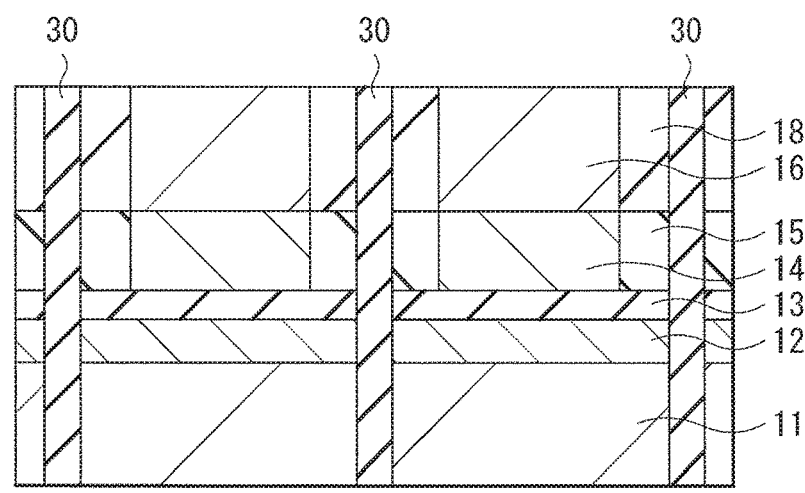
[ FIG. 7C ]
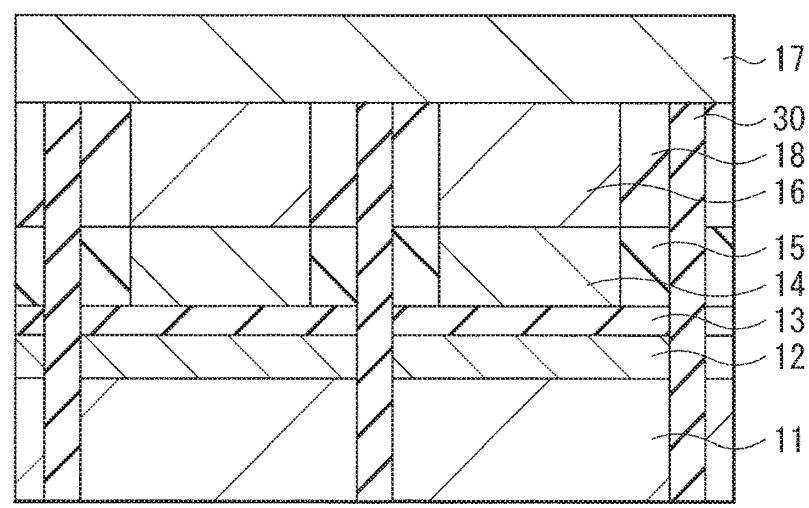

[ FIG. 8 ]
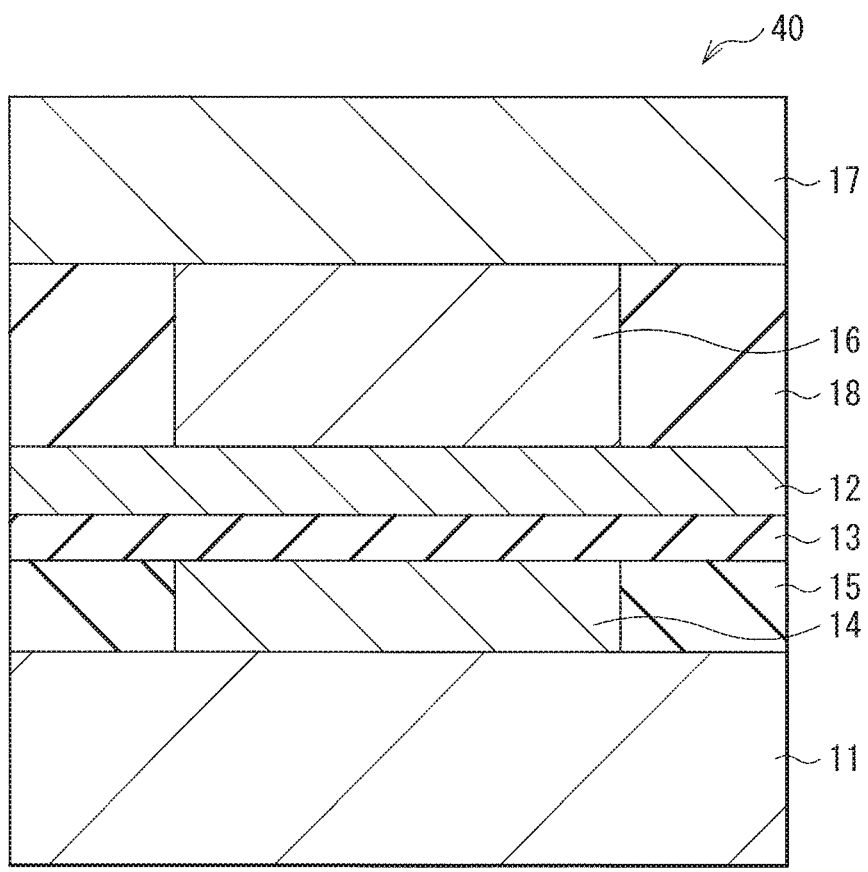

[ FIG. 9A ]
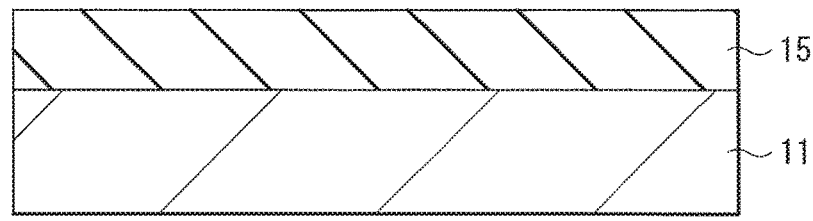
[ FIG. 9B ]
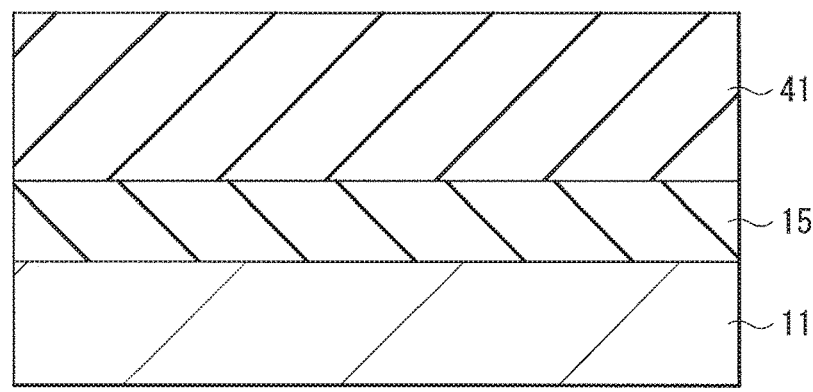
[ FIG. 9C ]
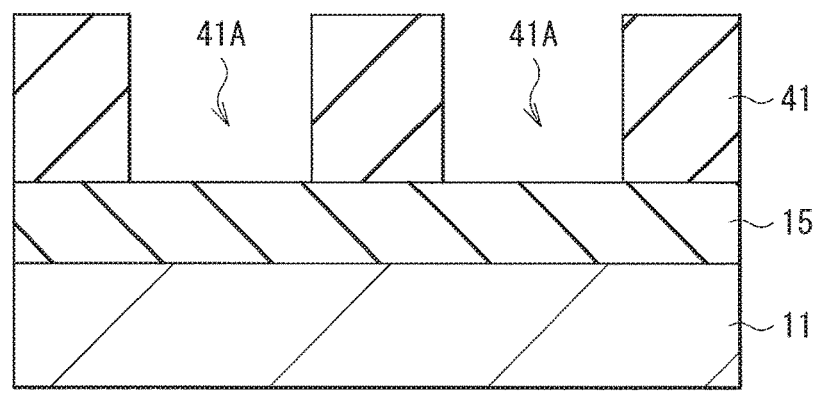
[ FIG. 9D ]
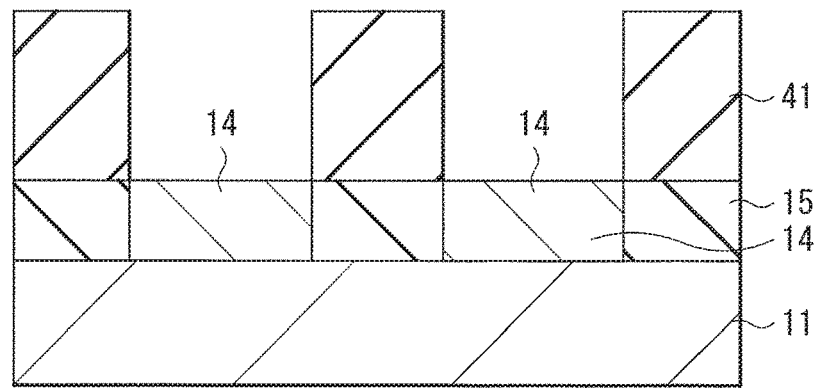

[ FIG. 10A ]
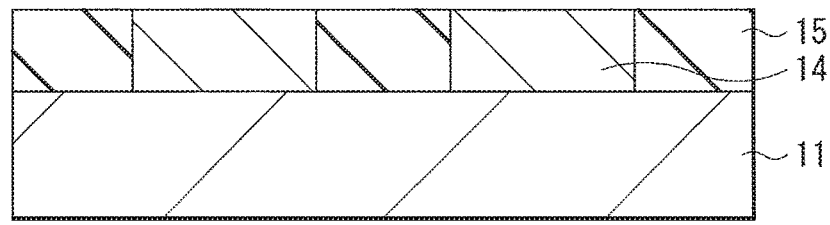
[ FIG. 10B ]
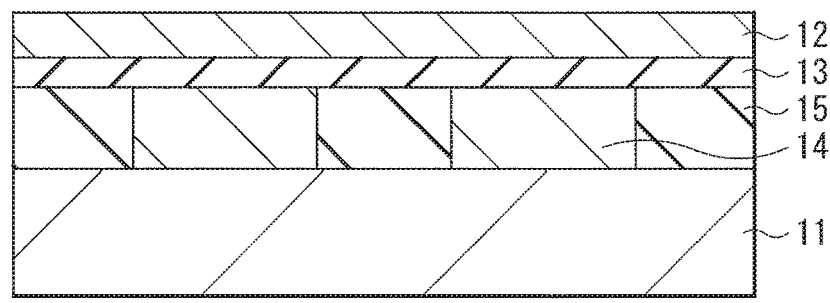
[ FIG. 10C ]
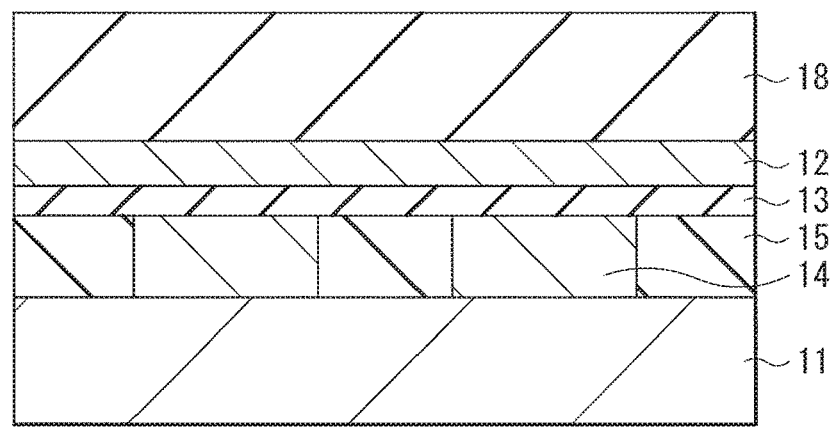
[ FIG. 10D ]
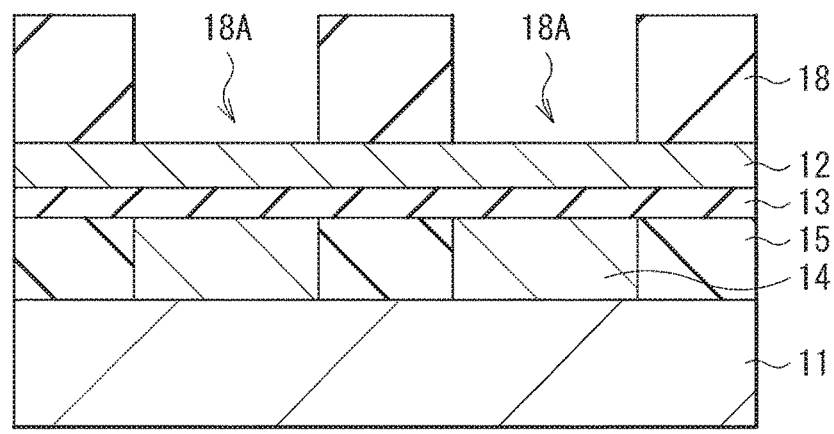

[ FIG. 11A ]
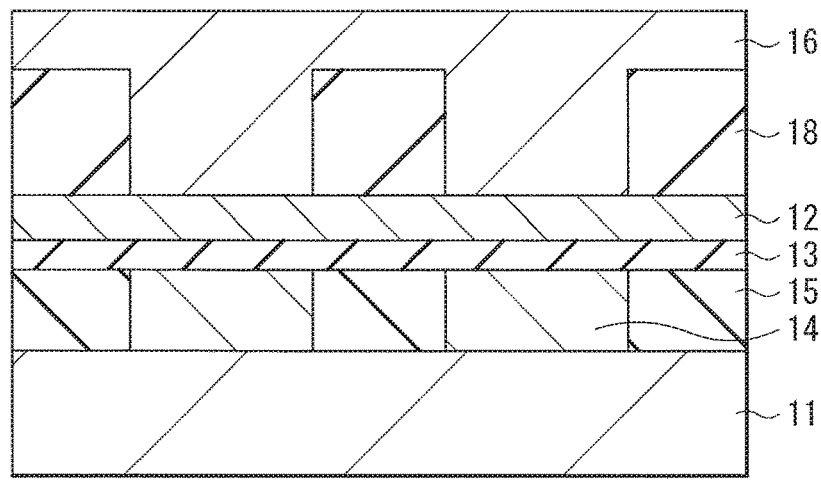
[ FIG. 11B ]
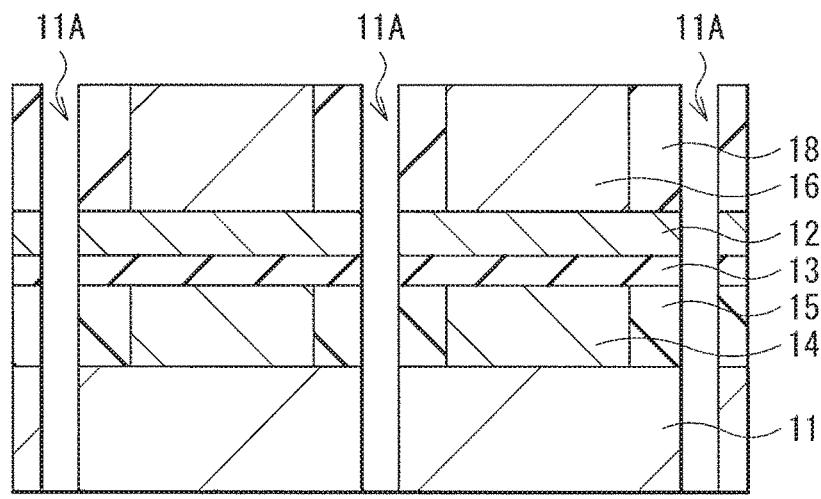
[ FIG. 11C ]
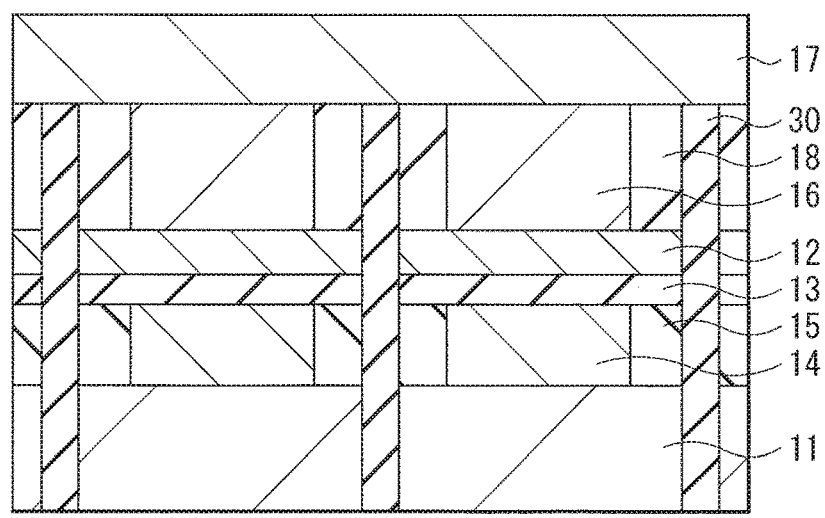

NONVOLATILE MEMORY DEVICE HAVING AN OXIDIZED MAGNETIC MATERIAL FILM AROUND A MAGNETIC MATERIAL LAYER AND METHOD OF MANUFACTURING THE SAME

CROSS REFERENCE TO RELATED APPLICATIONS

This application is a national stage application under 35 U.S.C. 371 and claims the benefit of PCT Application No. PCT/JP2017/004495 having an international filing date of 8 Feb. 2017, which designated the United States, which PCT application claimed the benefit of Japanese Patent Application No. 2016-071169 filed 31 Mar. 2016, the entire disclosures of each of which are incorporated herein by reference.

TECHNICAL FIELD

The present disclosure relates to a nonvolatile memory device that holds information through changing an electrical resistance value depending on a magnetization reversal state, and a method of manufacturing the same.

BACKGROUND ART

In information devices such as computers, a DRAM having high density and high operation speed is widely used as a RAM (Random Access Memory). However, the DRAM is a volatile memory in which information is deleted upon powering off. A nonvolatile memory in which information is not deleted is therefore desired. As a candidate for the nonvolatile memory, an MRAM (Magnetoresistive Random Access Memory) that holds information by magnetization of a magnetic material is under development.

Methods of writing to the MRAM include a method in which magnetization is reversed by a current magnetic field, and a method in which spin-polarized electrons are directly injected into a storage layer to cause magnetization reversal. Attention has been focused specifically on a spin injection magnetization reversal writing system that allows a writing current to be reduced with a reduction in device size.

Incidentally, a nonvolatile memory device having the spin injection magnetization reversal writing system has a structure (MTJ (Magnetic Tunnel Junction) structure) in which an insulator film is sandwiched between two magnetic material layers. In order to put a nonvolatile memory device having the MTJ structure into practical use, technology for patterning the magnetic material layer without occurrence of damage, a short circuit, and current leakage is necessary. For example, PTL 1 discloses a method of forming the MTJ structure without damage through stopping etching of a magnetic material layer (a second magnetic material layer) on an insulator film (tunnel insulating film) in the middle, oxidizing a remaining portion to be etched of the second magnetic material layer, and thereafter reducing the oxidized portion.

CITATION LIST

Patent Literature

PTL 1: Japanese Unexamined Patent Application Publication No. 2011-54873

SUMMARY OF THE INVENTION

However, it is difficult to control a depth of etching in actuality, and a further improvement in reliability and stabilization of characteristics are desired.

It is desirable to provide a nonvolatile memory device and a method of manufacturing a nonvolatile memory device that allow for an improvement in reliability and stabilization of characteristics.

A nonvolatile memory device according to an embodiment of the present disclosure includes: a first electrode and a second electrode facing each other; a first magnetic material layer and a second magnetic material layer provided between the first electrode and the second electrode; an insulator layer provided between the first magnetic material layer and the second magnetic material layer; and an oxidized magnetic material film provided around the first magnetic material layer.

A method of manufacturing a nonvolatile memory device according to an embodiment of the present disclosure includes the following processes (A) to (E):

(A) forming each of a first electrode and a second electrode;

(B) forming an oxidized magnetic material film between the first electrode and the second electrode;

(C) forming a first magnetic material layer in the oxidized magnetic material film;

(D) forming a second magnetic material layer between the first electrode and the second electrode, and (E) forming an insulator layer between the first magnetic material layer and the second magnetic material layer.

In the nonvolatile memory device according to the embodiment of the present disclosure and the method of manufacturing the nonvolatile memory device according to the embodiment of the present disclosure, after the oxidized magnetic material film is formed, the first magnetic material layer is formed in the oxidized magnetic material film, which makes it possible to prevent occurrence of a short circuit between the second magnetic material layer and the first magnetic material layer and to suppress variations in device area.

According to the nonvolatile memory device of the embodiment of the present disclosure and the method of manufacturing the nonvolatile memory device of the embodiment of the present disclosure, the first magnetic material layer is formed in the previously formed oxidized magnetic material film, which makes it possible to suppress occurrence of a short circuit and variations in device area, to improve reliability, and to stabilize characteristics. It is to be noted that effects described here are not necessarily limited and may include any of effects described in the present disclosure.

BRIEF DESCRIPTION OF THE DRAWINGS

FIG. 1 is a schematic cross-sectional view of a configuration of a nonvolatile memory device according to a first embodiment of the present disclosure.

FIG. 2A is a perspective view of an example of a shape of the nonvolatile memory device illustrated in FIG. 1.

FIG. 2B is a perspective view of another example of the shape of the nonvolatile memory device illustrated in FIG. 1.

FIG. 3 is a schematic cross-sectional view of a configuration of a nonvolatile memory using the nonvolatile memory device illustrated in FIG. 1.

FIG. 4 is an equivalent circuit diagram of the nonvolatile memory illustrated in FIG. 3.

FIG. 5A is a schematic cross-sectional view of an example of a process of manufacturing the nonvolatile memory device illustrated in FIG. 1.

FIG. 5B is a schematic cross-sectional view following FIG. 5A.

FIG. 5C is a schematic cross-sectional view following FIG. 5B.

FIG. 6A is a schematic cross-sectional view following FIG. 5C.

FIG. 6B is a schematic cross-sectional view following FIG. 6A.

FIG. 6C is a schematic cross-sectional view following FIG. 6B.

FIG. 7A is a schematic cross-sectional view following FIG. 6C.

FIG. 7B is a schematic cross-sectional view following FIG. 7A.

FIG. 7C is a schematic cross-sectional view following FIG. 7B.

FIG. 8 is a schematic cross-sectional view of a configuration of a nonvolatile memory device according to a second embodiment of the present disclosure.

FIG. 9A is a schematic cross-sectional view of an example of a process of manufacturing the nonvolatile memory device illustrated in FIG. 8.

FIG. 9B is a schematic cross-sectional view following FIG. 9A.

FIG. 9C is a schematic cross-sectional view following FIG. 9B.

FIG. 9D is a schematic cross-sectional view following FIG. 9C.

FIG. 10A is a schematic cross-sectional view following FIG. 9D.

FIG. 10B is a schematic cross-sectional view following FIG. 10A.

FIG. 10C is a schematic cross-sectional view following FIG. 10B.

FIG. 10D is a schematic cross-sectional view following FIG. 10C.

FIG. 11A is a schematic cross-sectional view following FIG. 10D.

FIG. 11B is a schematic cross-sectional view following FIG. 11A.

FIG. 11C is a schematic cross-sectional view following FIG. 11B.

MODES FOR CARRYING OUT THE INVENTION

In the following, some embodiments of the present disclosure are described in detail with reference to the drawings in the following order.

1. First Embodiment (an example in which a magnetization fixed layer, a tunnel barrier layer, and a magnetization free layer are laminated in this order)
   1-1. Configuration of Nonvolatile Memory Device
   1-2. Overall Configuration of Nonvolatile Memory
   1-3. Method of Manufacturing Nonvolatile Memory Device
   1-4. Workings and Effects
2. Second Embodiment (an example in which a magnetization free layer, a tunnel barrier layer, and a magnetization fixed layer are laminated in this order)
   2-1. Configuration of Nonvolatile Memory Device
   2-2. Method of Manufacturing Nonvolatile Memory Device 1. First Embodiment (1-1. Configuration of Nonvolatile Memory Device)

FIG. 1 schematically illustrates a cross-sectional configuration of a nonvolatile memory device 10 according to a first embodiment of the present disclosure. The nonvolatile memory device 10 has a so-called MTJ structure between a lower electrode 11 (a first electrode) and an upper electrode 17 (a second electrode) facing each other. In the MTJ structure, an insulator layer (a tunnel barrier layer 13) is sandwiched between two magnetic material layers (a magnetization fixed layer 12 and a magnetization free layer 14). FIGS. 2A and 2B are perspective views of the nonvolatile memory device 10. In the nonvolatile memory device 10, the magnetization fixed layer 12 (a second magnetic material layer), the tunnel barrier layer 13, and the magnetization free layer 14 (a first magnetic material layer) are laminated in this order, and a cap layer 16 is provided between the magnetization free layer 14 and the upper electrode 17. In the nonvolatile memory device 10 according to the present embodiment, the magnetization free layer 14 is formed through reducing a portion of an oxidized magnetic material film 15 provided on the tunnel barrier layer 13, and the oxidized magnetic material film 15 remains around the magnetization free layer 14.

The lower electrode 11 has, for example, a single-layer structure including copper (Cu), aluminum (Al), gold (Au), platinum (Pt), titanium (Ti), molybdenum (Mo), tantalum (Ta), tungsten (W), TiN, TiW, WN, silicide, etc. Alternatively, the lower electrode 11 may have, for example, a laminated structure including a base layer and a Cu layer, an Au layer, a Pt layer, etc. formed on the base layer. The base layer includes at least one of ruthenium (Ru), magnesium (Mg), calcium (Ca), vanadium (V), niobium (Nb), manganese (Mn), iron (Fe), cobalt (Co), nickel (Ni), chromium (Cr), or Ti, or an oxide including these elements. In a case where a film thickness in a Y-axis direction (hereinafter simply referred to as "thickness") of the base layer is too thick, smoothness is deteriorated, and in a case where the thickness of the base layer is too thin, the base layer is not able to function. Hence, the thickness of the base layer is preferably within a range from 3 nm to 30 nm both inclusive, for example. Moreover, the lower electrode 11 may include a single layer including Ta, etc. or a laminated structure including Cu, Ti, etc. The lower electrode 11 is formable by a PVD method exemplified as a sputtering method, for example.

The magnetization fixed layer 12 has a fixed magnetization direction, and serves as a reference to recorded information (a magnetization direction) of the magnetization free layer 14. The magnetization fixed layer 12 is a reference to information, and the magnetization direction of the magnetization fixed layer 12 is not allowed to be changed by writing or reading. However, the magnetization direction of magnetization fixed layer 12 is not necessarily fixed to a specific direction, and it is only necessary for magnetization of the magnetization fixed layer 12 to be less movable than that of the magnetization free layer 14. Examples of a material configuring the magnetization fixed layer 12 include ferromagnetic materials such as nickel (Ni), Fe, and Co and alloys thereof (for example, Co—Fe, Co—Fe—Ni, Fe—Pt, Ni—Fe, etc.). In addition, the examples include alloys prepared through mixing a non-magnetic element (for example, Ta, boron (B), strontium (Sr), Pt, silicon (Si), carbon (C), nitrogen (N), etc.) into these alloys, an oxide including one or more kinds of Co, Fe, and Ni (for example, ferrite: Fe—MnO, etc.), a group of intermetallic compounds called half-metallic ferromagnetic materials (Heusler alloys: NiMnSb, Co$_2$MnGe, Co$_2$MnSi, Co$_2$CrAl, etc.), and oxides (for example, (La, Sr)MnO$_3$, CrO$_2$, Fe$_3$O$_4$, etc.). Alternatively, gadolinium (Gd) may be added to these alloys.

The magnetization fixed layer 12 essentially has any crystallinity, and may be polycrystalline, monoclystalline, or amorphous.

The magnetization fixed layer 12 may have, for example, a laminated ferrimagnetic structure (that is a laminated structure having antiferromagnetic coupling, and is also called synthetic antiferromagnetic coupling (SAF: Synthetic Antiferromagnet)), or may have a magnetostatic coupling structure. Moreover, an antiferromagnetic material layer may be disposed adjacent to the magnetization fixed layer 12. Disposing the antiferromagnetic material layer adjacent to the magnetization fixed layer 12 makes it possible to obtain strong unidirectional magnetic anisotropy by exchange interaction occurring between these two layers. The laminated ferrimagnetic structure has, for example, a three-layer structure including a magnetic material layer/a Ru layer/a magnetic material layer (specifically, for example, a three-layer structure including CoFe/Ru/CoFe, and a three-layer structure including CoFeB/Ru/CoFeB), and indicates a structure in which interlayer exchange coupling of the two magnetic material layers becomes antiferromagnetic or ferromagnetic by a thickness of the ruthenium layer (for example, refer to S. S. Parkin et. al, Physical Review Letters, 7 May, pp 2304-2307 (1990)). Moreover, a structure in which antiferromagnetic coupling is obtained in two magnetic material layers by a magnetic field leaked from end surfaces of the magnetic material layers is called magnetostatic coupling structure. A material configuring the antiferromagnetic material layer may be an iron-manganese alloy, a nickel-manganese alloy, a platinum-manganese alloy, an iridium-manganese alloy, a rhodium-manganese alloy, cobalt oxide, or nickel oxide. In order to improve crystallinity of the antiferromagnetic material layer, a base layer including Ta, Cr, Ru, Ti, etc. may be formed between the lower electrode 11 and the antiferromagnetic material layer. Further, the magnetization fixed layer 12 may include various kinds of magnetic semiconductors, and may be soft magnetic (a soft film) or hard magnetic (a hard film).

The tunnel barrier layer 13 magnetically separates the magnetization free layer 14 and the magnetization fixed layer 12 from each other, and allows a tunnel current to pass therethrough. Examples of a material configuring the tunnel barrier layer 13 include insulating materials such as aluminum oxide (AlO$_x$), aluminum nitride (AlN), magnesium oxide (MgO), magnesium nitride, silicon oxide (SiO$_x$), silicon nitride (SiN$_x$), TiO$_2$, CrzO$_3$, Ge, NiO, CdOx, HfO$_2$, Ta$_2$O$_5$, BN, and ZnS. The tunnel barrier layer 13 may have, for example, a thickness of 0.5 nm to 2 nm.

The tunnel barrier layer 13 is obtainable, for example, through oxidizing or nitriding a metal film formed by a sputtering method. Specifically, in a case where aluminum oxide (AlO$_x$) or magnesium oxide (MgO) is used as an insulating material configuring a tunnel insulating film, there may be exemplified a method of oxidizing, in the air, Al or Mg formed by the sputtering method, a method of plasma-oxidizing Al or Mg formed by the sputtering method, a method of plasma-oxidizing, with use of an ICP, Al or Mg formed by the sputtering method, a method of naturally oxidizing, in oxygen, Al or Mg formed by the sputtering method, a method of oxidizing, by oxygen radicals, Al or Mg formed by the sputtering method, a method of irradiating Al or Mg formed by the sputtering method with ultraviolet rays while naturally oxidizing Al or Mg in oxygen, a method of forming a film of Al or Mg by a reactive sputtering method, or a method of forming a film of AlOx or MgO by a sputtering method. These layers are formable by a sputtering method, an ion beam deposition method, a physical vapor deposition (PVD) method that is exemplified as a vacuum deposition method, or a chemical vapor deposition (CVD) method that is represented by an ALD (Atomic Later Deposition) method.

The magnetization free layer 14 changes its magnetization direction corresponding to a voltage applied between the lower electrode 11 and the upper electrode 17, and information is recorded in the nonvolatile memory device 10 by the magnetization direction. Examples of a material configuring the magnetization free layer 14 include ferromagnetic materials such as Ni, Fe, and Co and alloys thereof (for example, Co—Fe, Co—Fe—Ni, Fe—Pt, Ni—Fe, etc.) as with the magnetization fixed layer 12. In addition, the examples include alloys prepared through mixing a non-magnetic element (for example, Ta, B, Sr, Pt, Si, C, N, etc.) into these alloys, an oxide including one or more kinds of Co, Fe, and Ni (for example, ferrite: Fe—MnO, etc.), a group of intermetallic compounds called half-metallic ferromagnetic materials (Heusler alloys: NiMnSb, Co$_2$MnGe, Co$_2$MnSi, Co$_2$CrAl, etc.), and oxides (for example, (La, Sr)MnO$_3$, CrO$_2$, Fe$_3$O$_4$, etc.). Alternatively, Gd may be added to these alloys. The magnetization free layer 14 may have a single-layer structure or a laminated structure in which a plurality of different ferromagnetic material layers are laminated. Alternatively, the magnetization free layer 14 may have a laminated structure in which a ferromagnetic material layer and a non-magnetic material layer are laminated.

The magnetization free layer 14 essentially has any crystallinity, and may be polycrystalline, monoclystalline, or amorphous.

The magnetization free layer 14 is formed through reducing a portion of the oxidized magnetic material film 15, as described above. Specifically, as will be described in detail later, the oxidized magnetic material film 15 is formed on the tunnel barrier layer 13, and thereafter, an insulating film 18 is formed as a mask on the oxidized magnetic material film 15. A window 18A (refer to FIG. 5C) is formed in the insulating film 18, and the oxidized magnetic material film 15 in the window 18A is reduced to form the magnetization free layer 14. As illustrated in FIGS. 2A and 2B, the magnetization free layer 14 has a columnar shape having a smaller diameter than those of the magnetization fixed layer 12 and the tunnel barrier layer 13, and is surrounded by the oxidized magnetic material film 15. A planar shape in an XZ plane of the magnetization free layer 14 is a substantially perfect circular shape. A side surface of the magnetization free layer 14 forms, together with the cap layer 16 to be described later, a surface perpendicular to an in-plane (XZ plane) direction of the lower electrode 11, for example.

The oxidized magnetic material film 15 includes an oxide including an element configuring the above-described magnetization free layer 14. Specifically, for example, in a case where the magnetization free layer 14 includes a Co—Fe—B alloy, the oxidized magnetic material film 15 includes Co—Fe-Box. The oxidized magnetic material film 15 is formed through oxidizing a magnetic material, for example. The magnetic material configuring the oxidized magnetic material film 15 is oxidized, thereby being non-magnetized, and losing conductivity as well. In the present embodiment, the oxidized magnetic material film 15 is formed as a preliminary layer for formation of the magnetization free layer 14 (a functional layer).

The cap layer 16 prevents interdiffusion of atoms configuring the magnetization free layer 14 and atoms configuring the upper electrode 17, and reduces contact resistance to prevent oxidation of the magnetization free layer 14. Moreover, the cap layer 16 electrically couples the magnetization free layer 14 and the upper electrode 17 to each other. Examples of a material configuring the cap layer 16 include TiN, Ta, Ru, Pt, and MgO. The cap layer 16 is formed as a single-layer structure or a laminated structure (for example, a Ru film/a Ta film) including these materials.

The upper electrode 17 has, for example, a single-layer structure including Cu, Al, Au, Pt, Ti, Mo, Ta, W, TiN, TiW, WN, silicide, etc. Alternatively, the upper electrode 17 has, for example, a laminated structure including a base layer and a Cu layer, an Au layer, a Pt layer, etc. formed on the base layer. The base layer includes Cr, Ti, etc. Alternatively, the upper electrode 17 may include a single layer including Ta, etc. or a laminated structure including Cu, Ti, etc. The upper electrode 17 is formable by, for example, a PVD method exemplified as a sputtering method, as with the lower electrode 11.

The insulating film 18 serves as a mask of the oxidized magnetic material film 15 for formation of the magnetization free layer 14, as described above. Examples of a material configuring the insulating film 18 include $SiO_x$, $SiN_x$, etc. The nonvolatile memory device 10 is formed in, for example, a columnar shape having a side surface in which the lower electrode 11, the magnetization fixed layer 12, the tunnel barrier layer 13, the oxidized magnetic material film 15, and the insulating film 18 are sequentially disposed, as illustrated in FIG. 2A. A column including the magnetization free layer 14 and the cap layer 16 and having a substantially perfect circular planar shape with a smaller diameter is formed inside a column including the lower electrode 11, the magnetization fixed layer 12, the tunnel barrier layer 13, the oxidized magnetic material film 15, and the insulating film 18, specifically, inside the oxidized magnetic material film 15 and the insulating film 18 on the tunnel barrier layer 13.

It is to be noted that the column including the lower electrode 11, the magnetization fixed layer 12, the tunnel barrier layer 13, the oxidized magnetic material film 15, and the insulating film 18 may have, for example, an elliptic cylindrical shape or a truncated conical shape. Moreover, in the nonvolatile memory device 10, the lower electrode 11, the magnetization fixed layer 12, and the tunnel barrier layer 13 may be formed in a plate shape (for example, a rectangular shape), as illustrated in FIG. 2B. Further, in the nonvolatile memory device 10 according to the present embodiment, for example, any other unillustrated layer may be provided between the magnetization free layer 14 and the cap layer 16 and between the cap layer 16 and the upper electrode 17. For example, an insulator layer including MgO, etc. may be provided between the magnetization free layer 14 and the cap layer 16.

(1-2. Entire Configuration of Nonvolatile Memory)

FIG. 3 schematically illustrates a cross-sectional configuration of a nonvolatile memory 1 including the nonvolatile memory device 10 according to the present embodiment. FIG. 4 is an equivalent circuit diagram of the nonvolatile memory 1. The nonvolatile memory 1 includes a plurality of nonvolatile memory devices 10 and two kinds of wiring lines for address that intersect with each other. Examples of the two kinds of wiring lines include a word line and a bit line. The nonvolatile memory 1 has a configuration in which each of the nonvolatile memory devices 10 is disposed around an intersection of the word line and the bit line between the word line and the bit line. In the nonvolatile memory 1, for example, a selection transistor 20 for selection of each of the nonvolatile memory devices 10 is provided in a region separated by a device separation region 24 provided in a semiconductor substrate 21 including Si, etc., as illustrated in FIG. 3.

The selection transistor 20 includes a pair of a source region 21A and a drain region 21B, and a gate electrode 23. The source region 21A and the drain region 21B are formed with a gap in between in the semiconductor substrate 21, and the gate electrode 23 is provided on the semiconductor substrate 21 with a gate insulating film 22 in between. The gate electrode 23 also serves as a wiring line for address (for example, the word line) extending in a Z-axis direction, for example. The drain region 21B is coupled to, for example, a wiring line 27 provided on an insulating layer 25 on the semiconductor substrate 21 via a contact 26 penetrating through the insulating layer 25.

The nonvolatile memory device 10 is disposed between the gate electrode 23 serving as the word line and the other wiring line for address (for example, the bit line) extending in an X-axis direction, for example. Specifically, the nonvolatile memory device 10 is disposed on an insulating layer 28. The insulating layer 28 is provided on the insulating layer 25 covering the gate electrode 23 and on the wiring line 27 provided on the insulating layer 25. In the present embodiment, the upper electrode 17 also serves as the bit line, and the nonvolatile memory device 10 is disposed around an intersection where the upper electrode 17 and the gate electrode 23 intersect with each other. The gate electrode 23 and the nonvolatile memory device 10 (specifically, the lower electrode 11) are electrically coupled to each other via a contact 29 and the source region 21A. Thus, a current in a Y-axis direction passes through the nonvolatile memory device 10 via two kinds of wiring lines, that is, the gate electrode 23 and the upper electrode 17 to apply a voltage between the lower electrode 11 and the upper electrode 17.

The nonvolatile memory 1 is, for example, a nonvolatile memory having a tunnel magnetoresistance (Tunnel Magneto Resistance; TMR) effect as a working principle, and performs writing and reading in the following manner, for example. In the nonvolatile memory device 10 configuring the nonvolatile memory 1, each of parallel and antiparallel states of magnetization alignments of two magnetic material layers (the magnetization fixed layer 12 and the magnetization free layer 14) configuring the MTJ structure is represented as "1" or "0".

First, upon writing, magnetization of the magnetization free layer 14 is reversed by a synthetic magnetic field generated by a current passing though the bit line and the word line. At this time, changing a direction of the current passing through the word line makes it possible to control magnetizations of the magnetization fixed layer 12 and the magnetization free layer 14 to orient the magnetizations parallel or antiparallel to each other. This enables rewriting and erasing of information.

Upon reading, the TMR effect is used. More specifically, the selection transistor is turned on, and a voltage drop that occurs by a current passing though the nonvolatile memory device 10 is measured. A magnitude of the voltage drop is used to determine whether the magnetization alignments of the magnetization fixed layer 12 and the magnetization free layer 14 are parallel (for example, "1") or antiparallel (for example, "0").

It is to be noted that the configuration illustrated in FIG. 3 represents a configuration example for description of the nonvolatile memory 1. For example, the upper electrode 17 may be formed for each of the nonvolatile memory devices 10, and a wiring line serving as the bit line may be separately provided.

(1-3. Method of Manufacturing Nonvolatile Memory Device)

The nonvolatile memory device 10 according to the present embodiment is manufacturable in the following manner, for example.

First, as illustrated in FIG. 5A, for example, CoFeB, which is a magnetic material, as the magnetization fixed layer 12, and, for example, a MgO crystal film as the tunnel barrier layer 13 are formed in this order on the lower electrode 11 by, for example, sputtering. Subsequently, for example, a CoFeBOx film is formed as the oxidized magnetic material film 15 on the tunnel barrier layer 13.

Next, for example, the insulating film 18 including SiN is formed as a mask on the oxidized magnetic material film 15, as illustrated in FIG. 5B. Subsequently, the window 18A corresponding to a device size (for example, a circular shape having a diameter of about 60 nm) of the nonvolatile memory device 10 and penetrating through the insulating film 18 is formed by, for example, a photolithography method, as illustrated in FIG. 5C.

Next, a region of the oxidized magnetic material film 15 in the window 18A is reduced by, for example, a hydrogen plasma method, as illustrated in FIG. 6A. Thus, the magnetization free layer 14 (a CoFeB layer) is formed in the oxidized magnetic material film 15. Subsequently, as illustrated in FIG. 6B, for example, a TiN film is formed in the window 18A and on the insulating film 18 with use of, for example, a damascene method, and thereafter, as illustrated in FIG. 6C, the TiN film is planarized by, for example, a CMP method to remove the TiN film on the insulating film 18. Thus, for example, the cap layer 16 having, together with the magnetization free layer 14, a side surface perpendicular to the XY plane direction of the lower electrode 11 is formed.

Next, a separation groove 11A penetrating to the lower electrode 11 is formed between adjacent devices by, for example, a photolithography method, as illustrated in FIG. 7A. Subsequently, as illustrated in FIG. 7B, for example, a film of SiN as an insulating layer 30 is formed in the separation groove 11A and on the cap layer 16 so as to fill in the separation groove 11A, and thereafter, for example, heat treatment at 350° C. or higher is performed. Thus, CoFeB configuring the magnetization free layer 14 is recrystalized and magnetized. Next, a surface of CoFeB is planarized by, for example, a CMP method to expose the cap layer 16. Lastly, for example, a Cu film is formed as the upper electrode 17 on the cap layer 16, the insulating film 18, and the insulating layer 30, as illustrated in FIG. 7C. Thus, the nonvolatile memory device 10 according to the present embodiment is completed.

(1-4. Workings and Effects)

In order to put an MTJ device having a structure (MTJ structure) in which an insulator film is sandwiched between two magnetic material layers into practical use as a nonvolatile memory, technology for forming the MTJ structure without occurrence of damage, a short circuit, and current leakage is necessary. Examples of a method of forming the MTJ structure include a method in which the magnetic material layer is oxidized in a state in which a portion of a tunnel insulating film remains to deteriorate conductivity. However, in this method, an etched object is adhered again to a side wall of the tunnel insulating film, which causes a possibility that a short circuit and current leakage occur. In order to solve this issue, as described above, a method of forming the MTJ structure without damage through stopping etching of the magnetic material layer on the tunnel insulating film in the middle, oxidizing a remaining portion to be etched of the magnetic material layer, and then reducing the oxidized portion is under development.

However, in patterning of the MTJ structure with use of etching, it is difficult to control a depth of etching, and there is a possibility that the magnetic material layer on the tunnel insulating film is completely etched by overetching to cause the etched object to be adhered again to the side wall of the tunnel insulating film as with the above method, thereby causing a possibility that a short circuit between two magnetic materials and current leakage occur. Moreover, there is a possibility that variations in device diameter occur due to insufficient etching. Hence, in a typical method of manufacturing the MTJ device, it is difficult to sufficiently secure reliability, and it is also difficult to stabilize characteristics.

In contrast, in the nonvolatile memory device 10 according to the present embodiment, the magnetization fixed layer 12, the tunnel barrier layer 13, and the oxidized magnetic material film 15 are formed in this order on the lower electrode 11, and thereafter, the oxidized magnetic material film 15 is reduced to form the magnetization free layer 14. The MTJ structure is formed without using etching in such a manner, which makes it possible to suppress a short circuit between the magnetization fixed layer 12 and the magnetization free layer 14 and occurrence of variations in device area. Accordingly, it is possible to improve reliability and to stabilize characteristics.

Moreover, it is possible to form the MTJ structure without using etching, which makes it possible to prevent damage to the magnetization free layer 14 and the tunnel barrier layer 13. Accordingly, it is possible to improve characteristics of the nonvolatile memory device 10 and to improve long-term reliability.

Further, in the nonvolatile memory device 10 according to the present embodiment, it is possible to easily form the planar shape thereof in a substantially perfect circular shape. Furthermore, in a typical nonvolatile memory device, side surfaces of a magnetization free layer and a cap layer are tapered (for example, at a cross-sectional taper angle of about 30°); however, in the nonvolatile memory device 10 according to the present embodiment, it is possible to form the side surface of the magnetization free layer 14 (and the cap layer 16) perpendicular to the semiconductor substrate 21. Accordingly, it is possible to further reduce variations in device diameter (device area).

2. Second Embodiment (2-1. Configuration of Nonvolatile Memory Device)

FIG. 8 schematically illustrates a cross-sectional configuration of a nonvolatile memory device 40 according to a second embodiment of the present disclosure. The nonvolatile memory device 40 according to the present embodiment differs from the foregoing embodiment in that the lower electrode 11 (the first electrode), the magnetization free layer 14 (the first magnetic material layer), the tunnel barrier layer 13 (the insulator layer), the magnetization fixed layer 12 (the second magnetic material layer), the cap layer 16, and the upper electrode 17 (the second electrode) are laminated in this order. As with the nonvolatile memory device 10 according to the foregoing first embodiment, the oxidized magnetic material film 15 remains around the magnetization free layer 14 formed between the lower electrode 11 and the tunnel barrier layer 13. It is to be noted that same components as those in the foregoing first embodiment are denoted by same reference numerals, and description thereof is omitted.

(2-2. Method of Manufacturing Nonvolatile Memory Device)

The nonvolatile memory device 40 according to the present embodiment is manufacturable in the following manner, for example.

First, for example, a CoFeBOx film is formed as the oxidized magnetic material film 15 on the lower electrode 11, as illustrated in FIG. 9A. Subsequently, for example, a mask 41 including SiN is formed on the oxidized magnetic material film 15, as illustrated in FIG. 9B. Next, a window 41A corresponding to a device size (for example, a circular shape having a diameter of about 60 nm) of the nonvolatile memory device 40 and penetrating through the mask 41 is formed by, for example, a photolithography method, as illustrated in FIG. 9C.

Next, a region of the oxidized magnetic material film 15 in the window 41A is reduced by, for example, a hydrogen plasma method, as illustrated in FIG. 9D. Thus, the magnetization free layer 14 (a CoFeB layer) is formed in the oxidized magnetic material film 15. Subsequently, the mask 41 is removed as illustrated in FIG. 10A, and thereafter, for example, an MgO crystal film as the tunnel barrier layer 13 and, for example, CoFeB, which is a magnetic material, as the magnetization fixed layer 12 are formed in this order on the magnetization free layer 14 and the oxidized magnetic material film 15 by, for example, sputtering, as illustrated in FIG. 10B.

Next, for example, the insulating film 18 including SiN is formed on the magnetization fixed layer 12, as illustrated in FIG. 10C, and thereafter, the window 18A penetrating through the insulating film 18 is formed at a position facing the magnetization free layer 14, as illustrated in FIG. 10D. Subsequently, for example, a TiN film is formed in the window 18A and on the insulating film 18 with use of, for example, a damascene method, as illustrated in FIG. 1A. Next, the TiN film is planarized by, for example, a CMP method to remove the TiN film on the insulating film 18, and thereafter, the separation groove 11A penetrating to the lower electrode 11 is formed between adjacent devices by, for example, a photolithography method, as illustrated in FIG. 11B.

Next, as illustrated in FIG. 11C, for example, a film of SiN as the insulating layer 30 is formed in the separation groove 11A and on the cap layer 16 so as to fill in the separation groove 1 IA, and thereafter, for example, heat treatment at 350° C. or higher is performed to recrystalize and magnetize CoFeB configuring the magnetization free layer 14. Subsequently, a surface of CoFeB is planarized by, for example, a CMP method to expose the cap layer 16, and thereafter, lastly, a film of Cu as the upper electrode 17 is formed on the cap layer 16, the insulating film 18, and the insulating layer 30. Thus, the nonvolatile memory device 40 according to the present embodiment is completed.

As described above, in the nonvolatile memory device 40 according to the present embodiment, the oxidized magnetic material film 15 is formed on the lower electrode 11, and the oxidized magnetic material film 15 is reduced to form the magnetization free layer, and thereafter, the tunnel barrier layer 13, the magnetization fixed layer 12, the cap layer 16, and the upper electrode 17 (the second electrode) are formed in order. The oxidized magnetic material film 15 is reduced to form the magnetization free layer 14 in such a manner, which makes it possible, irrespective of the laminating order of respective layers configuring the nonvolatile memory device 40, to suppress occurrence of a short circuit between the magnetization fixed layer 12 and the magnetization free layer 14 and variations in device area, to improve reliability, and to stabilize characteristics.

Although the present disclosure has been described with reference to the first embodiment and the second embodiment, the present disclosure is not limited to the foregoing embodiments, and may be modified in a variety of ways.

It is to be noted that the present technology may have the following configurations.

(1)

A nonvolatile memory device, including:

a first electrode and a second electrode facing each other;

a first magnetic material layer and a second magnetic material layer provided between the first electrode and the second electrode;

an insulator layer provided between the first magnetic material layer and the second magnetic material layer; and an oxidized magnetic material film provided around the first magnetic material layer.

(2)

The nonvolatile memory device according to (1), in which a side surface of the first magnetic material layer is perpendicular to an in-plane direction of the first electrode or the second electrode.

(3)

The nonvolatile memory device according to (1) or (2), in which the first magnetic material layer includes a plurality of layers.

(4)

The nonvolatile memory device according to any one of (1) to (3), in which the oxidized magnetic material film is formed including an oxide that includes an element configuring the first magnetic material layer.

(5)

The nonvolatile memory device according to any one of (1) to (4), in which the first magnetic material layer includes cobalt (Co), iron (Fe), and boron (B).

(6)

The nonvolatile memory device according to any one of (1) to (5), in which the oxidized magnetic material film includes cobalt (Co), iron (Fe), boron (B), and oxygen (O).

(7)

The nonvolatile memory device according to any one of (1) to (6), in which a planar shape of the first magnetic material layer is a substantially perfect circular shape.

(8)

The nonvolatile memory device according to any one of (1) to (7), in which the first magnetic material layer is a magnetization free layer of which a magnetization direction is changed corresponding to a voltage applied between the first electrode and the second electrode, and the second magnetic material layer is a magnetization fixed layer of which a magnetization direction is fixed.

(9)

The nonvolatile memory device according to (8), in which a cap layer is included between the magnetization free layer and the first electrode or the second electrode, and a side surface of the cap layer is perpendicular, together with a side surface of the magnetization free layer, to an in-plane direction of the first electrode or the second electrode.

(10)

A method of manufacturing a nonvolatile memory device, the method including:

forming each of a first electrode and a second electrode;

forming an oxidized magnetic material film between the first electrode and the second electrode;

forming a first magnetic material layer in the oxidized magnetic material film;

forming a second magnetic material layer between the first electrode and the second electrode; and forming an insulator layer between the first magnetic material layer and the second magnetic material layer.

(11)

The method of manufacturing the nonvolatile memory device according to (10), in which a portion of the oxidized magnetic material film is reduced, and thereafter is subjected to heat treatment to form the first magnetic material layer.

(12)

The method of manufacturing the nonvolatile memory device according to (10) or (11), in which the second magnetic material layer, the insulator layer, and the oxidized magnetic material film are formed in this order on the first electrode, and a mask is formed on the oxidized magnetic material film, and thereafter a window penetrating through the mask, and the oxidized magnetic material film in the window is reduced by a hydrogen plasma method to form the first magnetic material layer.

(13)

The method of manufacturing the nonvolatile memory device according to (10) or (11), in which the oxidized magnetic material film is formed on the first electrode, and a mask is formed on the oxidized magnetic material film, and thereafter, a window penetrating through the mask is formed, and the oxidized magnetic material film in the window is reduced by a hydrogen plasma method to form the first magnetic material layer.

(14)

The method of manufacturing the nonvolatile memory device according to (13), in which after the first magnetic material layer is formed, the insulator layer and the second magnetic material layer are formed in this order on the oxidized magnetic material film and the first magnetic material layer.

(15)

The method of manufacturing the nonvolatile memory device according to any one of (12) to (14), in which the window is filled with a conductive material with use of a damascene method.

This application claims the benefit of Japanese Priority Patent Application No. 2016-071169 filed with the Japan Patent Office on Mar. 31, 2016, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nonvolatile memory device, comprising:
a first electrode and a second electrode facing each other;
a first magnetic material layer and a second magnetic material layer provided between the first electrode and the second electrode;
an insulator layer provided between the first magnetic material layer and the second magnetic material layer;
an oxidized magnetic material film provided around the first magnetic material layer;
a cap layer provided between the first magnetic material layer and the first electrode; and
an insulating film provided between the first electrode and the oxidized magnetic material film,
wherein the insulating film surrounds the cap layer, and wherein end portions of each of the insulating film, the oxidized magnetic material film, the first electrode, the second electrode, the second magnetic layer and the insulating layer are aligned with each other in a vertical direction.

2. The nonvolatile memory device according to claim 1, wherein a side surface of the first magnetic material layer is perpendicular to an in-plane direction of the first electrode or the second electrode.

3. The nonvolatile memory device according to claim 1, wherein the first magnetic material layer includes a plurality of layers.

4. The nonvolatile memory device according to claim 1, wherein the oxidized magnetic material film is formed including an oxide that includes an element configuring the first magnetic material layer.

5. The nonvolatile memory device according to claim 1, wherein the first magnetic material layer includes cobalt (Co), iron (Fe), and boron (B).

6. The nonvolatile memory device according to claim 1, wherein the oxidized magnetic material film includes cobalt (Co), iron (Fe), boron (B), and oxygen (O).

7. The nonvolatile memory device according to claim 1, wherein a planar shape of the first magnetic material layer is a substantially perfect circular shape.

8. The nonvolatile memory device according to claim 1, wherein
the first magnetic material layer is a magnetization free layer of which a magnetization direction is changed corresponding to a voltage applied between the first electrode and the second electrode, and
the second magnetic material layer is a magnetization fixed layer of which a magnetization direction is fixed.

9. The nonvolatile memory device according to claim 8, wherein
a side surface of the cap layer is perpendicular, together with a side surface of the magnetization free layer, to an in-plane direction of the first electrode or the second electrode.

10. The nonvolatile memory device according to claim 1, wherein the insulting film contains silicon (Si).

11. The nonvolatile memory device according to claim 1, wherein the cap layer electrically couples the first magnetic material layer and the first electrode to each other.

12. The nonvolatile memory device according to claim 1, wherein the cap layer includes ruthenium (Ru) and tantalum (Ta).

13. A method of manufacturing a nonvolatile memory device, the method comprising:
forming each of a first electrode and a second electrode to face each other;
forming an oxidized magnetic material film between the first electrode and the second electrode;
forming a first magnetic material layer in the oxidized magnetic material film,
wherein the oxidized magnetic material film is provided around the first magnetic material layer;
forming a second magnetic material layer between the first electrode and the second electrode;
forming an insulator layer between the first magnetic material layer and the second magnetic material layer;
forming a cap layer between the first magnetic material layer and the first electrode;
forming an insulating film between the first electrode and the oxidized magnetic material film;
forming the insulating film to surround the cap layers; and forming end portions of each of the insulating film, the oxidized magnetic material film, the first electrode, the second electrode, the second magnetic layer and the insulating layer to align with each other in a vertical direction.

14. The method of manufacturing the nonvolatile memory device according to claim 13, wherein a portion of the oxidized magnetic material film is reduced, and thereafter is subjected to heat treatment to form the first magnetic material layer.

15. The method of manufacturing the nonvolatile memory device according to claim 13, wherein the second magnetic material layer, the insulator layer, and the oxidized magnetic material film are formed in this order on the second electrode, and a mask is formed on the oxidized magnetic material film, and thereafter a window penetrating through the mask is formed, and the oxidized magnetic material film in the window is reduced by a hydrogen plasma method to form the first magnetic material layer.

16. The method of manufacturing the nonvolatile memory device according to claim 15, wherein the window is filled with a conductive material with use of a damascene method.

17. The method of manufacturing the nonvolatile memory device according to claim 13, wherein forming the first magnetic material layer includes forming the first magnetic material layer with a plurality of layers.

18. The method of manufacturing the nonvolatile memory device according to claim 13, wherein forming the oxidized magnetic material film includes forming the oxidized magnetic film with an oxide that includes an element configuring the first magnetic material layer.

19. The method of manufacturing the nonvolatile memory device according to claim 13, wherein
the first magnetic material layer is a magnetization free layer of which a magnetization direction is changed corresponding to a voltage applied between the first electrode and the second electrode, and
the second magnetic material layer is a magnetization fixed layer of which a magnetization direction is fixed.

20. The method of manufacturing the nonvolatile memory device according to claim 13, further comprising forming the cap layer to electrically couple the first magnetic material layer and the first electrode to each other.

* * * * *